US008269949B2

(12) United States Patent
Vermeulen et al.

(10) Patent No.: US 8,269,949 B2
(45) Date of Patent: Sep. 18, 2012

(54) LITHOGRAPHIC APPARATUS AND DEVICE MANUFACTURING METHOD

(75) Inventors: Marcus Martinus Petrus Adrianus Vermeulen, Leende (NL); Andre Bernardus Jeunink, Bergeijk (NL); Erik Roelof Loopstra, Eindhoven (NL); Joost Jeroen Ottens, Veldhoven (NL); Rene Theodorus Petrus Compen, Valkenswaard (NL); Peter Smits, Baarlo (NL); Martijn Houben, 's-Hertogenbosch (NL); Hendrikus Johannes Marinus Van Abeelen, Moergestel (NL); Antonius Arnoldus Meulendijks, Arendonk (BE); Rene Wilhelmus Antonius Hubertus Leenaars, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 389 days.

(21) Appl. No.: 12/563,838

(22) Filed: Sep. 21, 2009

(65) Prior Publication Data

US 2010/0085551 A1    Apr. 8, 2010

Related U.S. Application Data

(60) Provisional application No. 61/103,396, filed on Oct. 7, 2008.

(51) Int. Cl.
*G03B 27/58* (2006.01)
*G03B 27/42* (2006.01)

(52) U.S. Cl. ............................. 355/72; 355/53

(58) Field of Classification Search ................ 355/53, 355/72–76; 361/234; 310/10, 12
See application file for complete search history.

(56) References Cited

U.S. PATENT DOCUMENTS

| | | | |
|---|---|---|---|
| 6,172,738 B1 * | 1/2001 | Korenaga et al. | 355/53 |
| 6,965,428 B2 * | 11/2005 | Muto et al. | 355/72 |
| 7,119,884 B2 * | 10/2006 | Ottens et al. | 355/72 |
| 7,532,310 B2 | 5/2009 | Mertens et al. | |
| 2006/0102849 A1 | 5/2006 | Mertens et al. | |
| 2007/0159616 A1 * | 7/2007 | Van De Ven et al. | 355/75 |
| 2009/0059199 A1 * | 3/2009 | Kuit et al. | 355/73 |

FOREIGN PATENT DOCUMENTS

| | | |
|---|---|---|
| CN | 1804725 | 7/2006 |
| JP | 7-125838 | 5/1995 |
| JP | 2003-324053 | 11/2003 |
| JP | 2003-332411 | 11/2003 |
| JP | 2007-305989 | 11/2007 |
| JP | 2007-311787 | 11/2007 |

OTHER PUBLICATIONS

Japanese Office Action dated Nov. 2, 2011 in corresponding Japanese Patent Application No. 2009-225775.
Chinese Office Action dated May 3, 2012 in corresponding Chinese Patent Application No. 200910178543,1.

* cited by examiner

*Primary Examiner* — Hung Henry Nguyen
(74) *Attorney, Agent, or Firm* — Pillsbury Winthrop Shaw Pittman LLP

(57) ABSTRACT

A lithographic apparatus includes an illumination system configured to condition a radiation beam; a support constructed to support a patterning device, the patterning device being capable of imparting the radiation beam with a pattern in its cross-section to form a patterned radiation beam; a mirror block provided with a substrate table constructed to hold a substrate; and a projection system configured to project the patterned radiation beam onto a target portion of the substrate, wherein the mirror block is constructed and arranged to reduce slip between the mirror block and the substrate table. Slip can occur if the acceleration of the mirror block is high and the substrate table slips locally with respect to the mirror block. Slip may lead to exposure errors since the position of the substrate is no longer determined with the desired accuracy.

18 Claims, 3 Drawing Sheets

PRIOR ART

LITHOGRAPHIC APPARATUS AND DEVICE
MANUFACTURING METHOD

CROSS REFERENCE TO RELATED APPLICATIONS

This application claims priority and benefit under 35 U.S.C. §119(e) to U.S. Provisional Patent Application No. 61/103,396, entitled "Lithographic Apparatus and Device Manufacturing Method", filed on Oct. 7, 2008. The content of that application is incorporated herein in its entirety by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a lithographic apparatus the substrate will be positioned underneath the projection system for projection of the image of the patterning device on target portions of the substrate. To project the image of the patterning device on different target portions of the substrate and to scan the substrate underneath the projection system the substrate is moved. The mirror block is therefore moveable by a positioning system. The mirror block transfers its movements via the substrate table (also called wafer table) to the substrate. The substrate table is clamped by vacuum to the mirror block (also called encoder block) via burls. A higher throughput of the lithographic projection apparatus can be achieved by faster movements of the substrate underneath the projection system. The faster movements will be achieved by higher accelerations which may cause (local) slip between the mirror block and the substrate table. Slip between the mirror block and the substrate table may lead to the substrate being at another position than previous determined and therefore to wrongly exposed substrates.

SUMMARY

It is desirable to avoid a (local) slip between the mirror block and the substrate table.

According to an embodiment of the invention, there is provided a lithographic apparatus including an illumination system configured to condition a radiation beam; a support constructed to support a patterning device, the patterning device being capable of imparting the radiation beam with a pattern in its cross-section to form a patterned radiation beam; a mirror block provided with a substrate table constructed to hold a substrate; and a projection system configured to project the patterned radiation beam onto a target portion of the substrate, wherein the mirror block is constructed and arranged to reduce slip between the mirror block and the substrate table.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
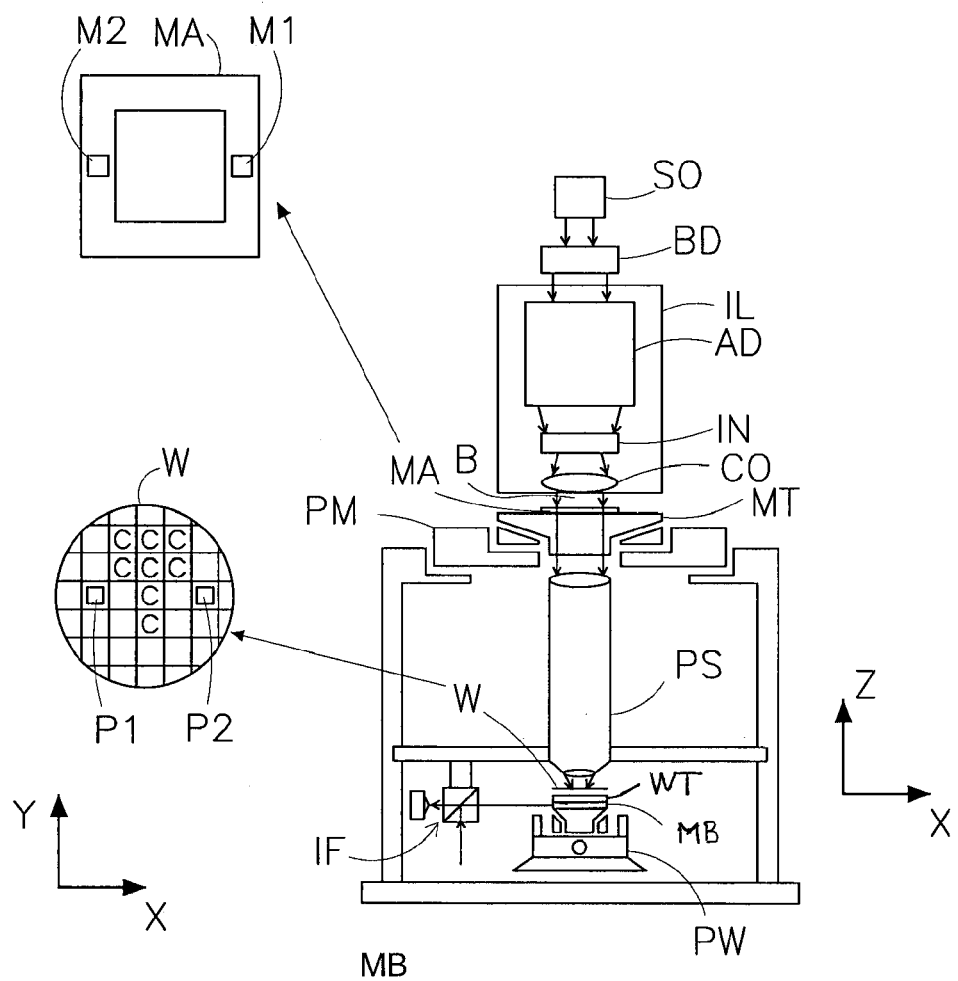
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The apparatus also includes a mirror block MB (also called encoder block) provided with a substrate table (also called wafer table) WT constructed to hold a substrate (e.g. a resist-coated wafer) W. The substrate table WT is clamped on the mirror block with a vacuum. Burls are provided in between the mirror block and the substrate table WT. The mirror block is connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more mirror blocks (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the mirror block MB can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the mirror block MB may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the mask alignment marks may be located between the dies.

The depicted apparatus could be used in at least one of the following modes:

1. In step mode, the patterning device support (e.g. mask table) MT and the mirror block MB or "substrate support" are kept essentially stationary, while an entire pattern imparted to the radiation beam is projected onto a target portion C at one time (i.e. a single static exposure). The mirror block MB or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT and the mirror block MB or "substrate support" are scanned synchronously while a pattern imparted to the radiation beam is projected onto a target portion C (i.e. a single dynamic exposure). The velocity and direction of the mirror block MB or "substrate support" relative to the patterning device support (e.g. mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT is kept essentially stationary holding a programmable patterning device, and the mirror block MB or "substrate support" is moved or scanned while a pattern imparted to the radiation beam is projected onto a target portion C. In this mode, generally a pulsed radiation source is employed and the programmable patterning device is updated as required after each movement of the mirror block MB or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Note that the mirror block MB, as stated above, comprises the substrate table WT. However, when the substrate table is discussed in relation to the main part of the mirror block (the main part of the mirror block is the mirror block without the substrate table) and when there is no risk of confusion then the term mirror block is used to refer only to the main part.

Figure 2A:
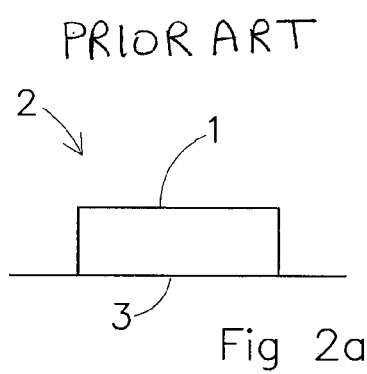
FIG. 2a depicts a cross-section of a conventional burl.
Figure 2B:
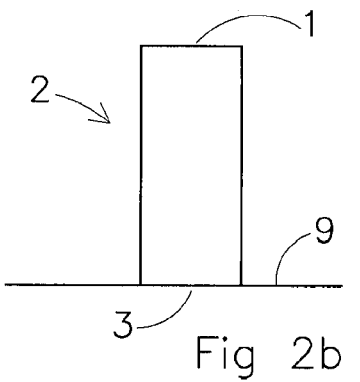
FIGS. 2b-2d depict cross sections of burls according to the invention.

To reduce slip between the mirror block MB and the substrate table, burls with increased flexibility can be provided between the mirror block MB and the substrate table in an embodiment of the invention. Slip may be caused by local deformation of the mirror block MB with respect to the substrate table due to acceleration forces exerted by the second positioning device on the mirror block MB. The areas of the mirror block MB where the second positioning device is connected to the substrate table may suffer from the largest deformations caused by the second positioning device. The increased flexibility makes it possible for the burls to absorb a part of the deformation without slipping, which provides significant benefits and superior properties in terms of reduction of slip between the mirror block MB and the substrate table. FIG. 2a discloses a cross section of a conventional rotational symmetric burl 2 and provided with a connection area 3 connected with surface 9 and a contact area 1. If the burl 2 is connected to the mirror block MB with its connection area 3 the substrate table will be supported with the contact area or surface 1 of the burl 2 and if the burl 2 is connected with its connection area 3 with the substrate table WT the mirror block MB will be in contact with the contact surface 1 of the burl 2. The burl may have a diameter of 0.5 mm and a height of 0.15 mm. To increase the flexibility the burl 2 may be provided with an increased length (see FIG. 2b). The increased length may be larger than about 0.15 mm, for example about 2.3 mm. These types of burls provide superior properties and benefits over conventional burls. Additionally the diameter may be minimized. However, it may difficult to make the diameter smaller when the burl is longer since the burl may break. For the burl with a length of about 2.3 mm, a diameter of about 1.5 mm is therefore selected. The diameter of 1.3 mm also reduces the contact stress between the burl and the substrate table if less burls are used.

Figure 2C:
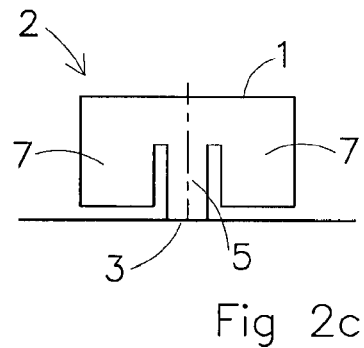
Figure 2D:
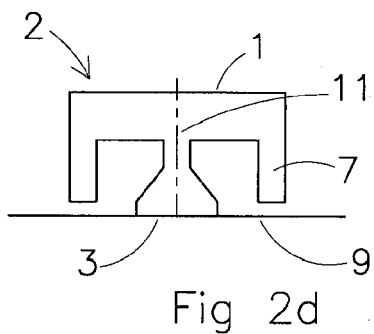

FIGS. 2c and 2d disclose burls with a design providing the burl with extra flexibility by having a smaller minimal connection area 3 than the contact surface 1 of the burl. In FIG. 2c, the burl is connected via a pillar 5, the pillar has a minimal connection area which has the same size over the whole length of the pillar and equals the connection area 3. The side parts 7 may provide a limitation to the flexibility if necessary. The flexibility of the burl of FIG. 2d may also be limited in the same way by side part 7 and surface 9. The flexibility of the burl in FIG. 2d is mainly determined by the minimal connection area 11 which is smaller than the connection area 3 of the burl 2 while the flexibility of the burl of FIG. 2c is determined over the full length of the pillar 11. A benefit of having the relatively large contact surface 1 of FIGS. 2c and 2d is that the contact stress is reduced with the surface of the substrate table or mirror block MB.

In an embodiment, another way of increasing the flexibility of the burls is to make them of a material with an improved flexibility. For example, the burls could be made of Zerodur™ with a Young's modulus of about 90 GPa. The flexibility of the material makes it possible to absorb more of the deformation of the wafer table WT before the burls will slip.

Figure 3:
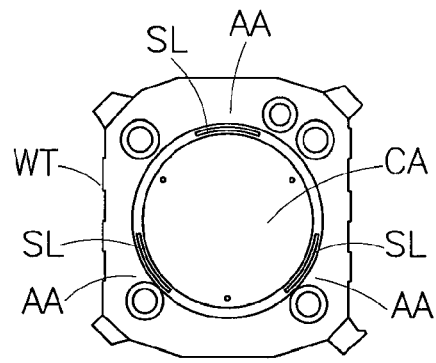
FIG. 3 depicts a mirror block according to an embodiment of the invention.

In an embodiment, another way of reducing slip between the mirror block MB and the substrate table WT is to reduce local deformation of the mirror block MB due to acceleration forces exerted by the second positioning device on the mirror block MB. An actuator area AA (see FIG. 3) of the mirror block MB where actuators of the second positioning device are connected to the mirror block MB may suffer from the largest deformations caused by the actuators. By providing slots SL in the mirror block MB between the clamping area CA for clamping the substrate table and the actuator area AA where the actuators configured to position the mirror block MB are connected to the mirror block MB, deformation of the mirror block MB caused by acceleration forces will to a smaller extend reach the clamping area CA. Since the clamping area CA will less deform, slip is less likely to occur because there is a smaller difference between the force on the burls in the deformed area and the other burls of the clamping area CA. The slots SL in FIG. 3 are substantially perpendicular to the surface of the clamping area CA but can also be made substantially parallel to the surface of the clamping area CA. If the slots are substantially perpendicular to the clamping area, force parallel to the surface of the clamping area will not cause deformation of the clamping areas and if the slots are substantially parallel to the surface of the clamping area the force in a direction perpendicular to the clamping area will not anymore deform the clamping area.

In an embodiment, the slip between the mirror block MB and the substrate table can also be reduced by constructing the mirror block MB with and increased stiffness. The increased stiffness can be accomplished by constructing the mirror block MB with a material with a higher stiffness. The mirror block MB can be made from cordierite having a Young's modulus of about 140 GPa or SiSic having a Young's modulus of about 360 GPa to increase the stiffness. Another possibility is to improve the thickness of certain parts of the mirror block MB. For example, the clamping area CA can be made of thicker material to provide additional stiffness to that part of the mirror block MB so that the deformation of the clamping area CA will be smaller during acceleration of the mirror block MB.

Figure 4A:
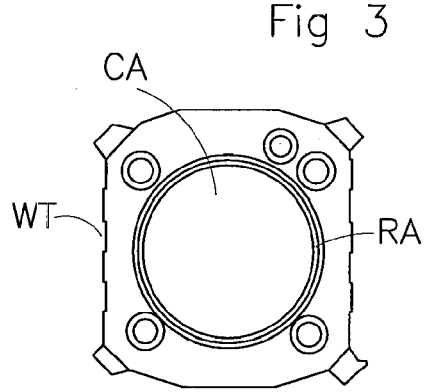
FIGS. 4a and 4b depict mirror blocks according to further embodiments of the invention.
Figure 4B:
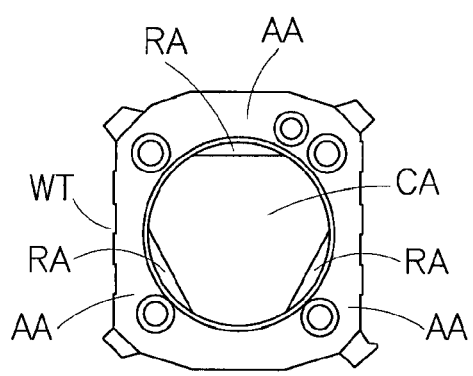

FIGS. 4a and 4b depict mirror blocks MB constructed for a reduced slip. The substrate table is clamped with vacuum on burls provided in the clamping area CA of the mirror block MB. By having a substrate table WT that is larger than the clamping area CA of the mirror block MB a reduced clamping area RA with no burls is created where no clamping occurs. In FIG. 4a, the reduced clamping area RA is around the edges of the clamping area CA reducing slip around the edges of the clamping area CA. In FIG. 4b, the reduced area RA is close to the actuator area AA of the mirror block MB where actuators of the second positioning device are connected to the mirror block MB reducing slip close to the actuator area AA where deformation of the mirror block MB is maximal.

The slip between the mirror block MB and the substrate table can also be reduced by constructing the mirror block MB and the substrate table WT in such a way that the deformation of both is matched. The stiffness of the substrate table WT may therefore be decreased in the areas of high deformation of the mirror block MB. During acceleration of the mirror block MB the deformation of the mirror block MB will then result in a deformation of the substrate table. Such deformation is reversible when the acceleration stops so that it does not lead to any exposure errors. Slip is often not reversible so that when the acceleration stops the substrate table and the mirror block MB will not be in the same position with respect to each other as before the slip occurred. Slip therefore leads to exposure errors. Another option is to provide burls with an improved flexibility in areas of high deformation so as to better absorb the deformations in these areas during accelerations of the mirror block MB.

The mirror block MB may be constructed and arranged to reduce slip between the mirror block MB and the substrate table by having a lower number of burls. Ten thousand burls may be provided between the mirror block MB and the substrate table according to the prior art. To minimize the slip between the mirror block MB and the substrate table this number may be reduced to 150, which provides significant benefits. Specifically, the friction on a burl is determined by the clamping force per burl times the friction coefficient. The clamping force is caused by the vacuum working on the area of the substrate table. By distributing this clamping force over less burls the clamping force and friction per burl can be increased. The occurrence of local slip is thereby minimized.

The burls may also be provided with a high friction coating on their contact surface or the contact roughness may be changed to increase the friction. Slip is less likely to occur in the case of a higher contact roughness. Sticking between two well polished surfaces may also reduce slip. Slip may also be circumvented by temporarily shaking the mirror block MB. By shaking the mirror block MB contact between the mirror block MB and the substrate table is improved which increases the friction and decreases the chance of slip.

According to an embodiment of the invention there are burls provided with a relatively high stiffness in the center of the contact area between the mirror block whereas there are burls with a relatively low stiffness (so called "flexible" burls) provided at the edges of the contact area. The stiff burls in the center of the contact area are suitable for capturing the inertia of the substrate table WT with respect to the mirror block, since in the center of the contact area the load (mechanical stress) due to deformation of the mirror block is relatively low. At the edges of the contact area the deformations of the mirror block are relatively large such that the burls with the relatively low stiffness ("flexible" burls) are appropriate in order to ensure that no slip occurs at these edges. According to an embodiment, the stiffness of the burls could gradually increase from the center to the edges from 150% stiffness in the center (herewith the stiffness is related to conventional burls as used in a situation where all burls have the same stiffness) to 50% stiffness of the burls at the edges.

Figure 5A:
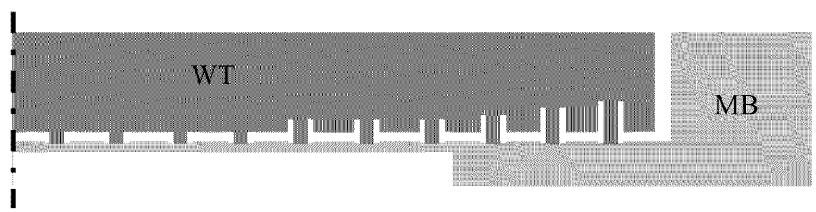
FIGS. 5a and 5b each depict in a vertical cross section a mirror block and a substrate table provided with clamping burls.

FIG. 5a is a vertical cross section schematically depicting a half part of an mirror block MB and an a substrate table WT. Herewith the substrate table WT is provided with burls of different stiffness. This is achieved by varying the height of the burls, which can be achieved by drilling a hole around the burl using a bore in the substrate table. The burls situated close to the edges are higher than the burls in the center contact region, while having the same diameter, such that the burls in the center have a higher stiffness than the burls close to the edges.

Figure 5B:
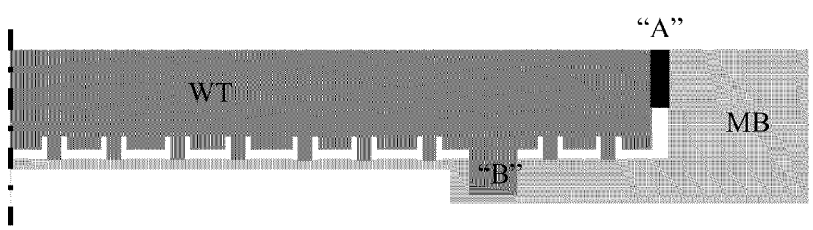

FIG. 5b is a vertical cross section schematically depicting a half part of a mirror block MB and a substrate table WT. In this embodiment the substrate table WT is coupled in a plane stiff to the mirror block MB. This coupling ensures that inertia forces of the substrate table with respect to the mirror block MB will not result in a sliding of the substrate table with respect to the mirror block, therewith ensuring the required accuracy for illumination of the substrates. In this way it is possible that the stiff substrate table WT reduces deformations of the mirror block MB. The said coupling can be realized by filling the gap between the mirror block MB and the substrate table WT with an coupling element A. Another way is to use one or more coupling elements in the form of a stiff rib B or stiff ribs B. According to the embodiment in FIG. 5b both the elements A and stiff ribs B are used.

In all embodiments according to the invention it is possible to provide burls which have an asymmetric horizontal cross-section in order to achieve the effect that the burls have a different stiffness in different horizontal directions. In this way the match between the mirror block and the substrate table can be optimized resulting in a minimal risk of slip.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV)

radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a support constructed to support a patterning device, the patterning device being capable of imparting a radiation beam with a pattern in its cross-section to form a patterned radiation beam;
   a mirror block provided with a substrate table constructed to hold a substrate; and
   a projection system configured to project the patterned radiation beam onto a target portion of the substrate,
   wherein a slot is provided in a surface of the mirror block between a clamping area for clamping the substrate table and an actuator area for connecting an actuator to the mirror block.

2. The apparatus according to claim 1, wherein the slot is provided in a direction substantially perpendicular to the clamping area.

3. The apparatus according to claim 1, wherein the slot is provided in a direction substantially parallel to the clamping area.

4. The apparatus according to claim 1, wherein the mirror block comprises a material with a Young's modulus higher than about 100 GPa.

5. The apparatus according to claim 1, wherein burls are provided in between the mirror block and the substrate table over a clamping area for clamping the substrate table on the mirror block.

6. The apparatus according to claim 5, wherein the clamping area is smaller than a size of the substrate table.

7. The apparatus according to claim 5, wherein the burls have a length larger than 0.15 mm.

8. The apparatus according to claim 5, wherein the burls have a length larger than 2 mm.

9. The apparatus according to claim 5, wherein the burls have a larger contact surface than a minimal connection area.

10. The apparatus according to claim 5, wherein no burls are present on the clamping area in an area close to an actuator area where an actuator configured to position the mirror block is connected to the mirror block.

11. A lithographic apparatus comprising:
    a support constructed to support a patterning device, the patterning device being capable of imparting a radiation beam with a pattern in its cross-section to form a patterned radiation beam;
    a mirror block provided with a substrate table constructed to hold a substrate; and
    a projection system configured to project the patterned radiation beam onto a target portion of the substrate,
    wherein burls extending in substantially a same direction are provided in between the mirror block and the substrate table over a clamping area for clamping the substrate table on the mirror block, and
    wherein the burls comprise flexible burls and additional burls, the flexible burls having an increased flexibility compared to the additional burls, wherein the flexible burls are present in an area close to an actuator area where an actuator configured to position the mirror block is connected to the mirror block and the additional burls are present in the rest of the clamping area.

12. The apparatus according to claim 5, wherein the burls comprise a rough contact surface.

13. The apparatus according to claim 5, wherein burls provided in the centre of the clamping area have a higher stiffness than burls provided at the edges of the clamping area.

14. The apparatus according to claim 5, wherein the mirror block and the substrate table are coupled with a relatively high stiffness in a horizontal plane using a connector element and/or a stiff rib.

15. The apparatus according to claim 11, wherein the direction is substantially perpendicular to the clamping area.

16. The apparatus according to claim 1, wherein the mirror block includes a recess to receive the substrate table, wherein the slot is arranged in a surface of the recess.

17. The apparatus according to claim 16, wherein the slot is arranged at a bottom of the recess.

18. The apparatus according to claim 16, wherein the slot is arranged between an outer periphery of the substrate table and a lateral surface of the recess.

* * * * *